(12) United States Patent
Buxton

(10) Patent No.: US 10,599,346 B2
(45) Date of Patent: Mar. 24, 2020

(54) DETERMINISTIC READ DISTURB COUNTER-BASED DATA CHECKING FOR NAND FLASH

(71) Applicant: Toshiba Memory Corporation, Minato-ku, Tokyo (JP)

(72) Inventor: Neil Buxton, Berkshire (GB)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 16/186,836

(22) Filed: Nov. 12, 2018

(65) Prior Publication Data

US 2019/0079684 A1 Mar. 14, 2019

Related U.S. Application Data

(63) Continuation of application No. 15/702,930, filed on Sep. 13, 2017, now Pat. No. 10,140,042.

(51) Int. Cl.
| | |
|---|---|
| *G11C 16/14* | (2006.01) |
| *G06F 3/06* | (2006.01) |
| *G11C 16/34* | (2006.01) |
| *G06F 11/07* | (2006.01) |
| *G11C 16/04* | (2006.01) |

(52) U.S. Cl.
CPC .......... *G06F 3/0619* (2013.01); *G06F 3/0655* (2013.01); *G06F 3/0679* (2013.01); *G06F 11/0727* (2013.01); *G06F 11/0754* (2013.01); *G06F 11/0793* (2013.01); *G11C 16/3431* (2013.01); *G06F 2201/81* (2013.01); *G11C 16/0483* (2013.01)

(58) Field of Classification Search
CPC ..... G06F 3/0619; G06F 3/0655; G06F 3/0679
See application file for complete search history.

(56) References Cited

U.S. PATENT DOCUMENTS

| | | | |
|---|---|---|---|
| 7,818,525 B1 * | 10/2010 | Frost | G06F 12/0246 |
| | | | 365/185.25 |
| 8,929,140 B2 | 1/2015 | Nagashima | |
| 9,053,808 B2 | 6/2015 | Sprouse et al. | |
| 9,098,416 B2 | 8/2015 | Mataya et al. | |

(Continued)

FOREIGN PATENT DOCUMENTS

CN 106155585 A 11/2016

OTHER PUBLICATIONS

Keonsoo Ha et al., "A Read-Disturb Management Technique for High-Density NAND Flash Memory," Research-Gate, Conference Paper, Jul. 2013, pp. 1-6.

*Primary Examiner* — Xiaochun L Chen
(74) *Attorney, Agent, or Firm* — White & Case LLP

(57) ABSTRACT

A data storage device comprises a non-volatile semiconductor memory device and a solid-state drive controller communicatively coupled to the non-volatile semiconductor memory device. The non-volatile semiconductor memory device can store data in memory blocks. The solid-state drive controller can, periodically, retrieve counts from a counter table, select a predetermined number of memory blocks corresponding to the lowest counts, and determine an integrity of the stored data in each of the predetermined number of memory blocks. Each count can correspond to a difference between a count limit and a number of read operations performed on one of the memory blocks.

22 Claims, 5 Drawing Sheets

(56) References Cited

U.S. PATENT DOCUMENTS

| | | | |
|---|---|---|---|
| 9,542,309 B2 | 1/2017 | Lasser | |
| 9,552,171 B2 | 1/2017 | Huang et al. | |
| 9,563,373 B2 | 2/2017 | Camp et al. | |
| 9,612,953 B1 | 4/2017 | Davis et al. | |
| 9,652,381 B2 | 5/2017 | Higgins et al. | |
| 9,710,317 B2 | 7/2017 | Gupta et al. | |
| 2009/0172267 A1 | 7/2009 | Oribe et al. | |
| 2012/0030506 A1 | 2/2012 | Post et al. | |
| 2012/0268994 A1 | 10/2012 | Nagashima | |
| 2013/0083606 A1 | 4/2013 | Marquart | |
| 2013/0346805 A1 | 12/2013 | Sprouse et al. | |
| 2014/0136884 A1 | 5/2014 | Werner et al. | |
| 2014/0173180 A1 | 6/2014 | D'Abreu et al. | |
| 2015/0138888 A1 | 5/2015 | Nagashima | |
| 2015/0262714 A1 | 9/2015 | Tuers et al. | |
| 2015/0364199 A1* | 12/2015 | Kang | H01L 27/10823 |
| | | | 714/764 |
| 2016/0019974 A1 | 1/2016 | Blodgett | |
| 2016/0034194 A1 | 2/2016 | Brokhman et al. | |
| 2016/0118132 A1 | 4/2016 | Prins et al. | |
| 2016/0211033 A1 | 7/2016 | Lee | |
| 2016/0225461 A1 | 8/2016 | Tuers et al. | |
| 2016/0378656 A1 | 12/2016 | Kudo | |
| 2017/0060657 A1 | 3/2017 | Healy et al. | |
| 2017/0160934 A1 | 6/2017 | Park et al. | |
| 2017/0161135 A1 | 6/2017 | Yen et al. | |
| 2017/0177425 A1 | 6/2017 | Jei et al. | |
| 2019/0079684 A1* | 3/2019 | Buxton | G06F 3/0619 |

\* cited by examiner

DETERMINISTIC READ DISTURB COUNTER-BASED DATA CHECKING FOR NAND FLASH

CROSS-REFERENCE TO RELATED APPLICATION

This application is a continuation of application Ser. No. 15/702,930 filed Sep. 13, 2017, the entire contents of which are incorporated herein by reference.

FIELD OF THE INVENTION

The present disclosure relates to data storage devices and methods for managing read disturb errors in memory blocks.

BACKGROUND

Solid-state storage devices employing non-volatile semiconductor memory such as NAND flash memory typically use block or page read counters as an indicator that checks should be made for memory blocks or pages that may be subject to read disturb errors. When a page or block counter, counting up or down, reaches a limit value, the solid-state drive (SSD) controller instigates a check of pages or memory blocks that may be affected by read disturb errors following the number of reads of the page or memory block monitored by the counter. Read disturb errors cause the data in neighboring pages within the memory block to change due to a weak programming effect of wordlines adjacent to the page or memory block being read.

Typically, block and page counters are employed with programmable limits but with no attempt to limit the number of counters that may hit the limits at any given time. With uncontrolled and unpredictable workloads, the only limit to the number of memory block and page counters that may simultaneously reach their limit for checking within a period is the rate of read commands to the memory, which in fast SSDs could exceed 1 million/second. A 'storm' occurs in a read disturb counter limit scheme where large numbers of counters may be allowed to simultaneously reach a limit and the associated likely disturb affected memory blocks must all be checked at the same time. This gives rise to a variable and unpredictable degradation of the performance of SSD controllers in solid-state storage devices with a direct influence on the performance seen by a host device. Accordingly, there is a long felt need to avoid the aforementioned problems.

SUMMARY OF INVENTION

The present disclosure relates to a data storage device comprising a non-volatile semiconductor memory device and an SSD controller, communicatively coupled to the non-volatile semiconductor memory device. The non-volatile semiconductor memory device can store data in memory blocks. The solid-state drive controller can, periodically, retrieve counts from a counter table, select a predetermined number of memory blocks corresponding to the lowest counts, and determine an integrity of the stored data in each of the predetermined number of memory blocks. Each count can correspond to a difference between a count limit and a number of read operations performed on one of the memory blocks.

According to one implementation, the period may be dynamically adjusted based on a rate of arrival of read memory requests at the data storage device.

In other implementations, the SSD controller may, in response to determining that the integrity of the stored data in the memory block is above a threshold, read the stored data in the memory block, error correct the stored data in the memory block, and transfer the stored data to a secondary memory block.

In certain implementations, the SSD controller may, in response to determining that the integrity of the stored data is below the threshold, set the count corresponding to the memory block in the counter table to a new limit.

According to some implementations, the SSD controller may determine an average number of memory blocks storing data corresponding to integrities above the threshold.

In some implementations, the predetermined number of memory blocks is greater than the average number of memory blocks.

According to one implementation, the SSD controller may dynamically adjust the predetermined number based on the total hours of operation of the data storage device.

In other implementations, the SSD controller may dynamically adjust the predetermined number based on a rate of arrival of read memory requests at the data storage device.

In certain implementations, the SSD controller may dynamically adjust the period and the predetermined number such that none of the counts reaches zero.

According to some implementations, determining the integrity of the stored data in the memory block comprises determining an error level of the stored data in at least one memory page of the memory block.

A second aspect of the present disclosure relates to a method of managing memory blocks in a data storage device. The method comprises storing data in a plurality of memory blocks. The method also comprises retrieving counts from a counter table. Each count may correspond to a difference between a count limit and a number of read operations performed on one of the memory blocks. Further, the method comprises selecting, based on the counts, a predetermined number of memory blocks corresponding to a plurality of lowest counts. The method also comprises determining, for each of the predetermined number of memory blocks, an integrity of the stored data in the memory block.

According to some implementations, the period is dynamically adjusted based on a rate of arrival of read memory requests at the data storage device.

In some implementations, the method further comprises, in response to determining that the integrity of the stored data in the memory block is above a threshold, reading the stored data in the memory block, error correcting the stored data in the memory block, and transferring the stored data to a secondary memory block.

In other implementations, the method further comprises, in response to determining that the integrity of the stored data in the memory block is below the threshold, setting the count corresponding to the memory block in the counter table to a new limit.

According to some implementations, the method also comprises determining an average number of memory blocks storing data corresponding to a plurality of integrities above the threshold.

In certain implementations, the predetermined number of memory blocks is greater than the average number of memory blocks.

In other implementations, the method also comprises, dynamically adjusting the predetermined number based on the total hours of operation of the data storage device.

According to some implementations, the method further comprises, dynamically adjusting the predetermined number based on a rate of arrival of read memory requests at the data storage device.

In certain implementations, the method also comprises, dynamically adjusting the period and the predetermined number such that none of the plurality of counts reaches zero.

In other implementations, the method further comprises, determining the integrity of the stored data in the memory block based on determining an error level of the stored data in at least one memory page of the memory block.

BRIEF DESCRIPTION OF THE DRAWINGS

The foregoing and other objects and advantages will be apparent upon consideration of the following detailed description, taken in conjunction with the accompanying drawings, in which like reference characters refer to like parts throughout, and in which.

DETAILED DESCRIPTION

Figure 1:
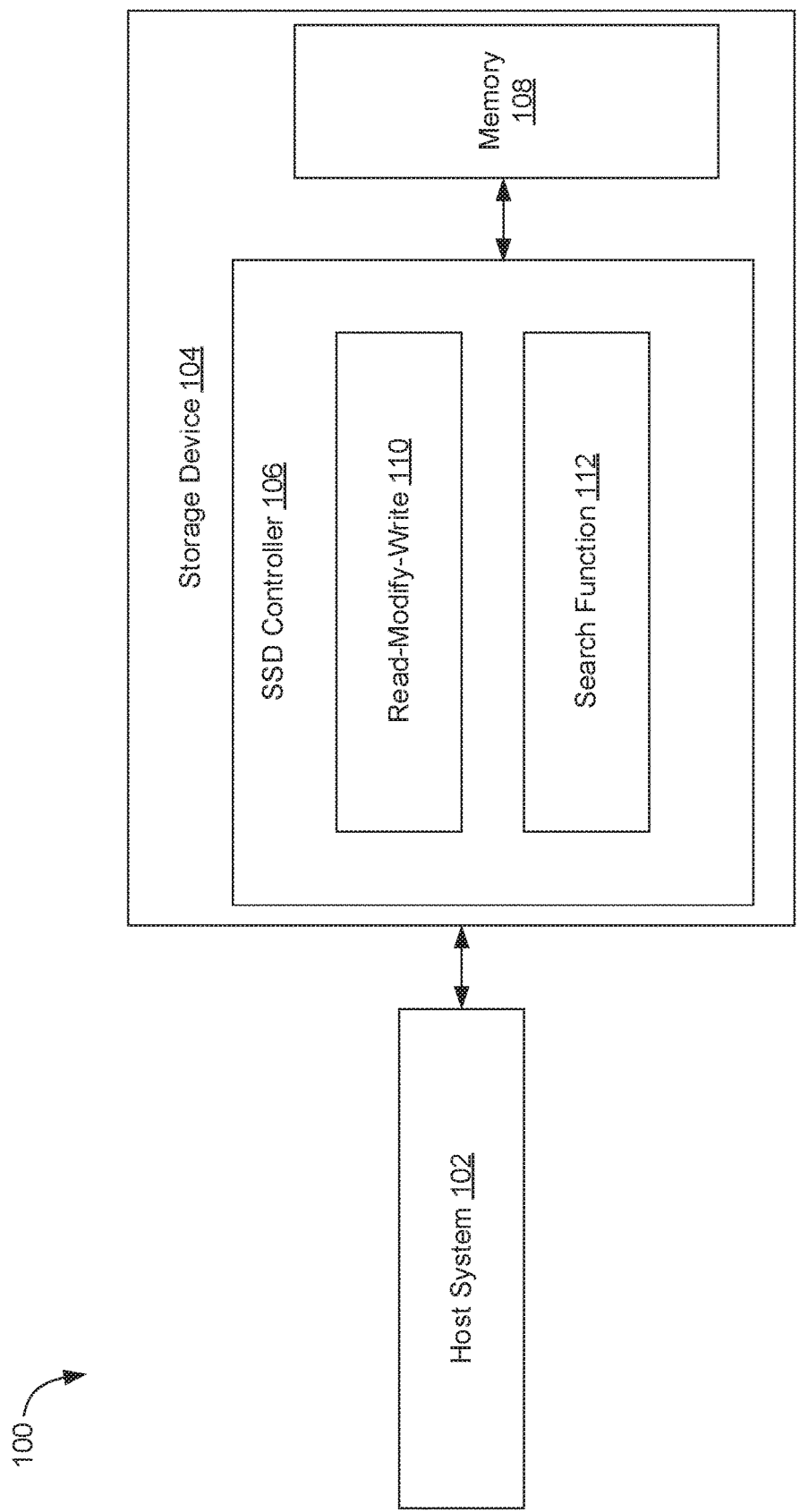
FIG. 1 shows a schematic representation of data storage device, configured according to one or more embodiments of the present disclosure.

FIG. 1 shows a schematic representation of a computing system 100 comprising a host system 102 and storage device 104. The host system 102 is communicatively coupled to the storage device 104, which is an SSD that comprising an SSD controller 106 and memory 108. The SSD controller 106 comprises read-write-modify circuitry 110 and search function circuitry 112 used by the controller 106 to perform deterministic refresh counting and data checking. The storage device 104 provides non-volatile storage functionality for use by the host system 102. Storage device 104 may also include other elements not shown, such as non-volatile semiconductor storage elements, power supply circuitry, indicator light circuitry, temperature sensors, boot circuitry, clock circuitry, and other circuitry for assisting with various functions.

The SSD controller 106 receives and processes commands from host system 102 in order to perform operations on the memory 108. Commands from host system 102 include requests to read or write to locations within the memory 108 and administrative commands, such as commands for querying the feature set of storage device 104, commands for formatting memory 108, commands for creating and modifying various types of queues, commands for requesting notification of various events, and various other commands.

Memory 108 is a non-volatile semiconductor memory that stores data at the request of the host system 102. Memory 108 includes one or more arrays of non-volatile semiconductor-based storage elements, some examples of which include non-volatile NAND flash memory, non-volatile NOR flash memory, non-volatile DRAM based memory, magnetoresistive random-access memory (MRAM), and other types of memory.

Figure 2:
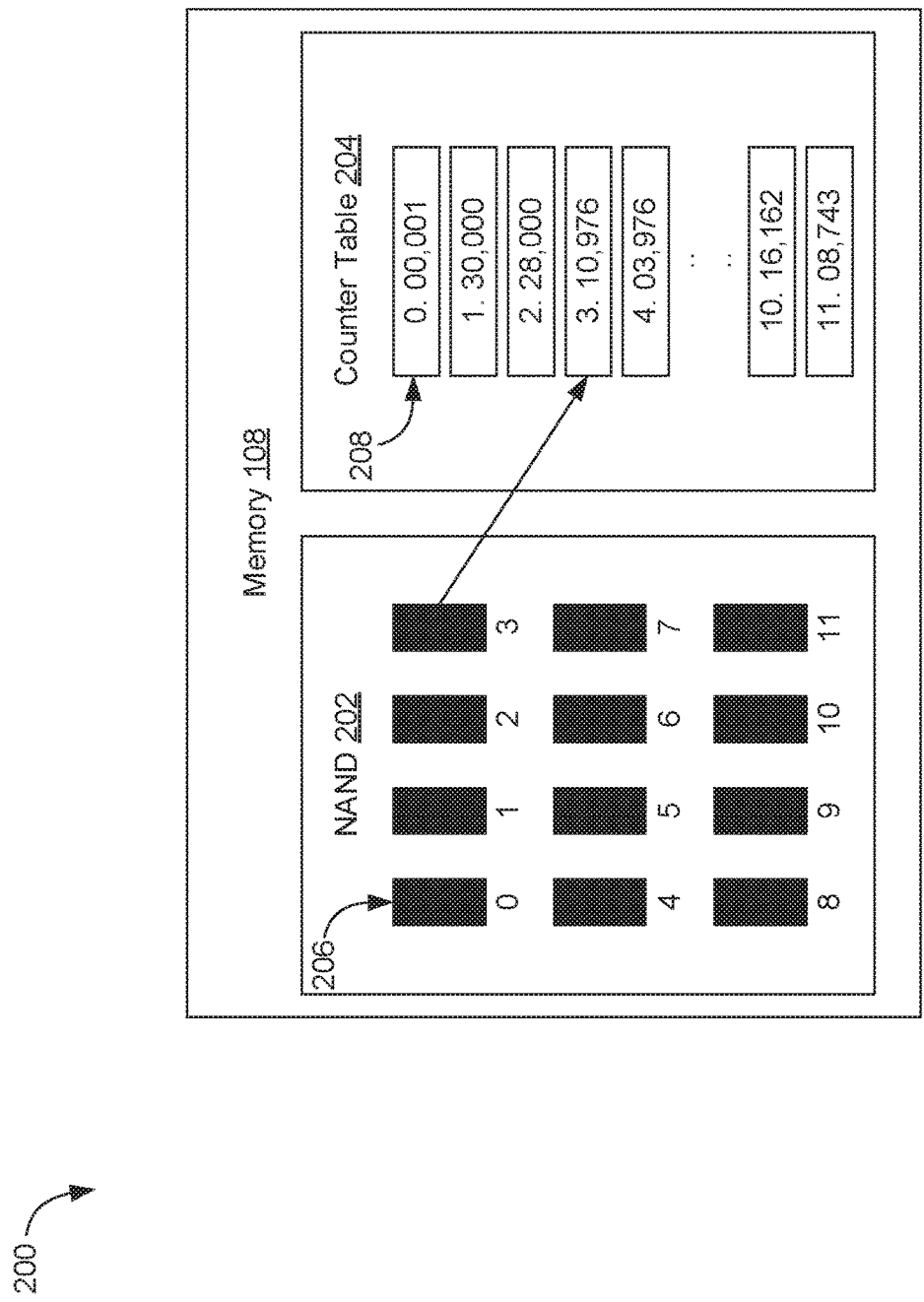
FIG. 2 shows a schematic representation of data storage device, according to an embodiment of the present disclosure.

FIG. 2 shows a schematic representation of memory 108 comprising a NAND flash memory 202 and counter table 204. NAND flash memory 202 includes memory blocks 206. Each memory block 206 stores data, and can be written to, read, and erased by the SSD controller 106 and such activities are tracked and counted using read-write-modify circuitry 110. Counter table 204 maintains counts 208 of read operations performed on each memory block 206. Counter table 204 can be stored in a DRAM or static random-access memory (SRAM). In other embodiments, NAND flash memory 202 can include counter table 204.

Each count 208 provides an indication of the number of read operations that have been performed on a corresponding memory block 206. Each count 208 is initialized to a predetermined number and decrements after a read operation is performed on a corresponding memory block 206. The initial value for each count 208 is related to the read disturb limit of the NAND flash memory 202. The read disturb limit is the point at which the read error rate exceeds the capability of the SSD controller 106 to correct errors in a NAND page. The initial value is selected such that the read disturb limit is preferably never reached. The read disturb limit is also related to the technology included in memory 108 as well as the scale of the fabrication process. As technologies have progressed, the effects of read disturb errors has increased. Having more charge states in a cell to enable more bits to be stored has decreased the limit. In some embodiments, the initial value for each count 208 is based on a read disturb limit specified for a particular memory technology.

Computing system 100 can be used to prevent and protect against read disturb errors by conducting a search at intervals of T seconds, at a rate of 1/T per second, to find the N minimum values and corresponding count 208 of memory block 206 in a counter table 204. The N minimum values correspond to the amount of memory blocks $206_N$ that have data with read disturb errors within an interval of T seconds. Counter table 204 contains counts 208 for each corresponding to memory blocks $206_N$. Searching for the N values requires a significant amount of system resources. A large T will require a large N and a small T will require a small N. T can be dynamically chosen based on the number of read operations the computing system 100 is performing. Computing system 100 can determine an average number of memory blocks $206_N$ storing data corresponding to error levels above the threshold within an interval of T seconds and select the N minimum values to be greater than the average number. The values of N and T will be dependent on the rate of arrival of read requests from the host system 102. Initial values may be chosen according to an expected or specified maximum rate of arrival of read requests.

The computing system 100 can conduct checks of memory blocks 206 potentially affected by errors resulting from read operations performed on the memory blocks 206. The system 100 relies on limiting the number of memory blocks 206 to be checked by identifying a predetermined number of check candidates periodically, such that, for any given workload it is highly likely to ensure that so-called checking 'storms' do not occur. The number of checks per second is N/T, so N and T scale in order for computing system 100 to maintain a sufficient checking rate. For example, N can be 8 or 16 if hardware implemented minimum collection is used. Hardware implemented minimum collection can be made into a bank of N registers inside a direct memory access search function circuitry 112 which searches the counter table 204. If the value of N is known, T can be determined to maintain a sufficient checking rate for an expected or specified maximum rate of arrival of read requests. For example, if N is 16 and T is 100 ms, 160 checks would be performed per second.

The computing system 100 can conduct checks of memory blocks 206$_N$ with test read operations on one or more memory pages of the memory blocks, which check for the error levels in data stored in the memory block 2061, and then transfers the data in the memory block 2061 to a secondary memory block 2062 if necessary. Secondary block 2062 may be a block 206 that had been erased and has a corresponding count 208 that is set to an initial value. SSD controller 106 can maintain a pool of memory blocks 206$_N$ that are already erased. Transferring the data takes place on memory blocks with high error levels and presumed likely to suffer from unrecoverable errors soon. Checking and relocation consumes memory bus bandwidth and SSD controller resources, causing unpredictable performance in terms of data transfer rates and latencies if not controlled.

Computing system 100 can limit the checking process to a predictable number at the known interval T, which enables the performance and resource degradation to be planned and managed to required specifications. Measurement of workload may enable the checking parameters, such as rate of checking and number of minimum counter candidates checked, to be varied and/or optimized to realize minimum performance degradation while still preventing checking 'storms.' Selection of constant values of N and T can ensure that the workload imposed by the checking process is deterministic. This, in turn, ensures that the effect of the workload on the normal operation of the SSD is to have a predetermined latency variation and performance throughput in the processing of read and write requests from the host system 102.

The selection of N and T is related to the number of IO read operations received by the storage device 104, the size of each IO operation and the page size of the memory blocks 206 (a memory block 26 being composed of pages, the page being the minimum portion of data which can be read in a NAND flash memory.) Consider a number of 4 KB IO operations per second of I. For NAND flash memory pages typically of at least 4 KB, each IO operation will cause a maximum of one memory page access. The total number of page (block) counts decremented (or incremented) in T seconds is (I*T). During this time, a predetermined number N block counters 208 are selected and checked, following which the counters 208 will be reset to a start limit or set to a new limit. In order for a steady state to exist, every T seconds the number N*BC (where BC is the block counter value of each of the N blocks) of block counts which are reset or set must equal the number of new block counts received. If N*BC is less than the new block counts received, I*T, then eventually the block counts may reach a limit (zero if the counts are decremented) in an uncontrolled manner, which is the condition which is to be avoided. Therefore N*BC must be greater or equal to I*T for stable operation. BC must be less than the read disturb limit RDL, for example RDL minus some safety margin SM, (RDL−SM). Therefore N must be greater than (I*T)/(RDL−SM).

The above assumes that the IO traffic is spread uniformly (or randomly) across the total blocks 206 of the storage device 104. Non-random traffic such as sequential page accesses or traffic which is focused on small number of blocks 206 within the storage device 104 may require extra safety margins to be added to any values chosen. Selection of the value T is based on the minimum period during which large variations in focused traffic may occur, typically of the order of ¼ second, therefore a T of 100 ms might offer a good safety margin. Values greater than 1 second increase the risk that focused traffic may cause the memory block counters 208 to hit their limits before sufficient checks have been made; values less than 100 ms may be largely unnecessary as the traffic variations are unlikely to be conducted over such short periods.

For example, a storage device 104 may have a rated performance specification of 1,000,000 IOPs. At 4 KB per IOP and a memory page of 4 KB, if T is 100 ms, I*T is 100,000. If RDL=30,000 and SM=5,000, (RDL−SM)=25,000. Therefore N must be greater than 100,000/25,000, or 4. If T were chosen as 250 ms, a value of 16 may be chosen (>10).

Figure 3:
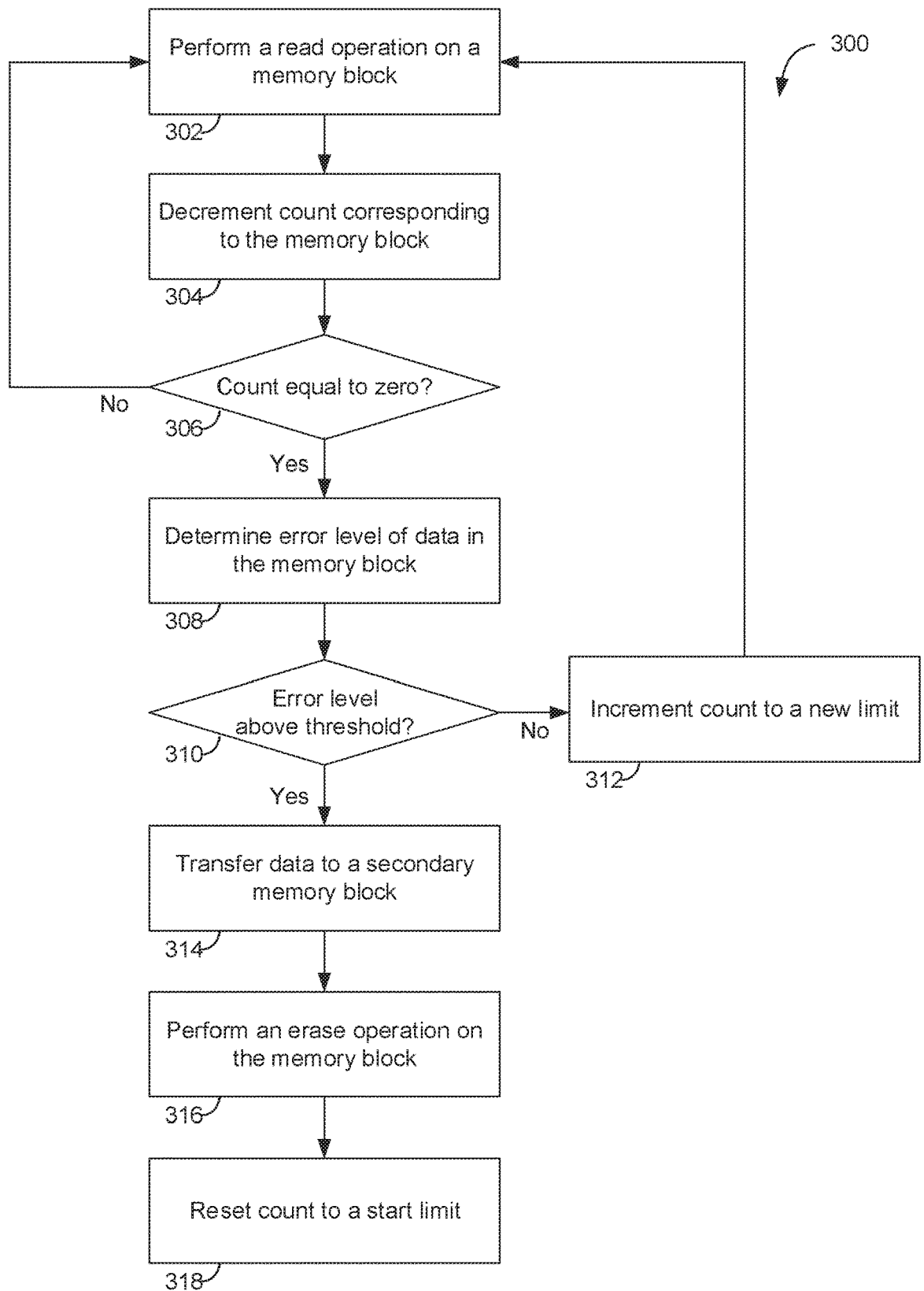
FIG. 3 is a flow diagram of method steps for managing memory blocks in a data storage device, according to an embodiment of the present disclosure.

Conventional systems use process 300 to manage memory blocks in a data storage device as illustrated in FIG. 3. The process 300 begins by performing a read operation on a memory block 206 in step 302. For example, SSD controller 106 can instruct the read-modify-write circuitry 110 to perform a read operation on memory block 206 of NAND flash memory 202.

Process 300 continues by decrementing a count 208 corresponding to the memory block 206 in step 304. For example, SSD controller 106 can decrement the value of count 208 in counter table 204 corresponding to the memory block 206 of NAND flash memory 202.

Process 300 continues by determining whether a value of the count 208 is equal to zero in step 306. For example, SSD controller 106 can determine whether the value of count 208 is equal to zero. If the value of the count 208 is not equal to zero, process 300 continues to step 302. Otherwise, if the value of the count 208 is equal to zero, process 300 continues to step 308.

Process 300 continues by determining an error level of data stored in the memory block 206 in step 308. For example, SSD controller 106 can determine an error level of data stored in the memory block 206 of NAND flash memory 202.

Process 300 continues by determining whether the error level of the data stored in the memory block 206 is above a threshold in step 310. For example, SSD controller 106 can determine if the determined error level of the data stored in the memory block 206 of NAND flash memory 202 is above the threshold error level. The threshold error level corresponds to an error level which is below the maximum error level that the SSD controller 106 can correct. If the error level of the data stored in the memory block 206 is not above the threshold error level, process 300 continues to step 312. Otherwise, if the error level of the data stored in the memory block 206 is above the threshold error level, process 300 continues to step 314.

Process 300 continues by incrementing the count 208 to a new limit in step 312. For example, SSD controller 106 can increment the value of count 208 in counter table 204 corresponding to the memory block 206 of NAND flash memory 202 up to a new limit. The new limit may be the same as a start limit or may be smaller than the start limit. For example, if the start limit is 30,000, the new limit may be 20,000. The new limit may be based on the rate at which the SSD controller 106 determines that the error level of the data stored in the memory block 206 of NAND flash memory 202 is above the threshold error level and the count 208 corresponding to the memory block 206.

Process 300 continues by transferring the data to a secondary memory block 206 in step 314. For example, SSD controller 106 can transfer the data stored in memory block 206 to a secondary memory block 206. The secondary memory block 206 may be a memory block 206 that is not currently storing data.

Process 300 continues by performing an erase operation on the memory block 206 in step 316. For example, SSD controller 106 can instruct the read-modify write circuitry 110 to perform an erase operation on the memory block 206 that had the error level above the threshold error level.

Process 300 finishes by resetting the count 208 corresponding to the memory block 206 to a start limit in step 318. For example, SSD controller 106 can reset the value of count 208 in counter table 204 corresponding to the memory block 206 of NAND flash memory 202 to a start limit.

After steps 306 and 312, process 300 proceeds to step 302 in order to check the error levels of the memory blocks 206 after each read operation.

Figure 4:
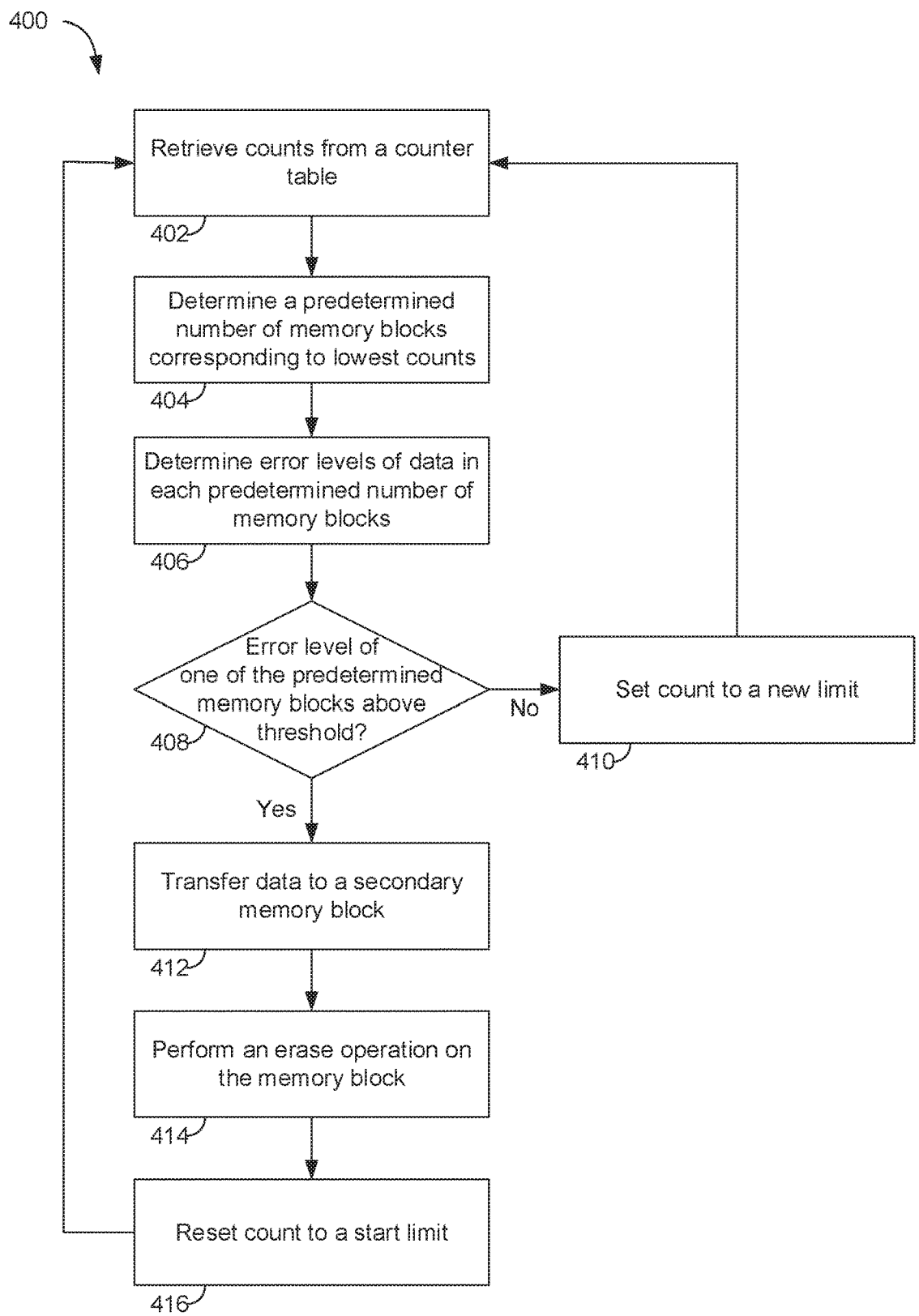
FIG. 4 is a flow diagram of method steps for managing memory blocks in a data storage device, according to an embodiment of the present disclosure.

A process 400 of managing memory blocks in a data storage device using computing system 100 is illustrated in FIG. 4. The process 400 begins by retrieving counts 208 from a counter table 204 in step 402. For example, SSD controller 106 can retrieve counts 208 from a counter table 204.

Process 400 continues by selecting a predetermined number of memory blocks 206 corresponding to the lowest counts 208 in step 404. For example, SSD controller 106 can instruct search function circuitry 112 to search for the memory blocks 206 of NAND flash memory 202 that have the lowest counts 208 in counter table 204 and select the predetermined number of memory blocks 206 which have the lowest counts 208. The predetermined number of memory blocks 206 may correspond to the amount of memory blocks $206_N$ that have data with read disturb errors within an interval of T seconds. A large T will require a large predetermined number of memory blocks 206 and a small T will require a small predetermined number of memory blocks 206. The predetermined number of memory blocks 206 may range from four to sixteen as previously indicated, however, the choice may also be dependent on the processing capability of the search function circuitry 112, where a smaller number of N may be preferred for example, if the search function is implemented in firmware or software and not hardware. The search function will read the counter table and collect the N minima in a bank of N registers.

Process 400 continues by determining the integrity of data in each predetermined number of memory blocks 206 in step 406. For example, SSD controller 106 can determine the error levels of each of the predetermined number of memory blocks 206. The error levels of each of the predetermined number of memory blocks 206 may be determined when the SSD controller 106 performs a read operation on a memory block 206. Once the SSD controller 106 performs a read operation on one or more of pages of the memory block 206, the SSD controller 106 can determine and correct any errors in the pages read from memory block 206 and can determine the error levels of the memory block 206.

Process 400 continues by determining whether the error level of one of the predetermined memory blocks 206 is above a threshold in step 408. For example, for each of the predetermined memory blocks 206, the SSD controller 106 can determine whether the error level of the stored data in the memory block 206 is above the threshold error level. If the error level of one of the predetermined memory blocks 206 is not above the threshold, process 400 continues to step 410. Otherwise, if the error level of one of the predetermined memory blocks 206 is above the threshold, process 400 continues to step 412.

Process 400 continues by setting the count 208 to a new limit in step 410. For example, for each of the predetermined memory blocks 206 with error levels not above the threshold error level, SSD controller 106 can increment the value of count 208 in counter table 204 corresponding to the memory block 206 of NAND flash memory 202 up to a new limit. The new limit may be the same as a start limit or may be smaller than the start limit. For example, if the start limit is 30,000, the new limit may be 20,000. The new limit may be based on the rate at which the SSD controller 106 determines that the error level of the data stored in the memory block 206 of NAND flash memory 202 is above the threshold error level and the count 208 corresponding to the memory block 206.

Process 400 continues by transferring the data to a secondary memory block 206 in step 412. The transfer involves reading the data, correcting any errors, and writing the error corrected data to the secondary memory block 206. For example, SSD controller 106 can transfer the data stored in memory block 206 to a secondary memory block 206. The secondary memory block 206 may be a memory block 206 that is erased and not currently storing data.

Process 400 continues by performing an erase operation on the memory block 206 in step 414. For example, For example, SSD controller 106 can instruct the read-modify write circuitry 110 to perform an erase operation on the memory block 206 that had the error level above the threshold error level. If more than one memory block 206 had an error level above the threshold error level, the SSD controller 106 can instruct the read-modify-write circuitry 110 to perform an erase operation on all of the memory blocks 206 that had an error level above the threshold error level.

Process 400 finishes by resetting the count 208 to a start limit step 416. For example, For example, SSD controller 106 can reset the value of count 208 in counter table 204 corresponding to the memory block 206 of NAND flash memory 202 to a start limit. The start limit may be dynamic in order for the SSD controller 106 to consider the sensitivity of the memory block 206 to read disturb errors. The start limit may be based on the rate at which the SSD controller 106 determines that the error level of the data stored in the memory block 206 of NAND flash memory 202 is above the threshold error level and the count 208 corresponding to the memory block 206. If more than one memory block 206 had an error level above the threshold error level, the SSD controller 106 can instruct the read-modify-write circuitry 110 to reset the value of the counts 208 in counter table 204 corresponding to all of the memory blocks 206 that had an error level above the threshold error level.

After steps 410 and 416, process 400 proceeds to step 402 in order to periodically check the error levels of the memory blocks 206 with the lowest counts 208.

Figure 5:
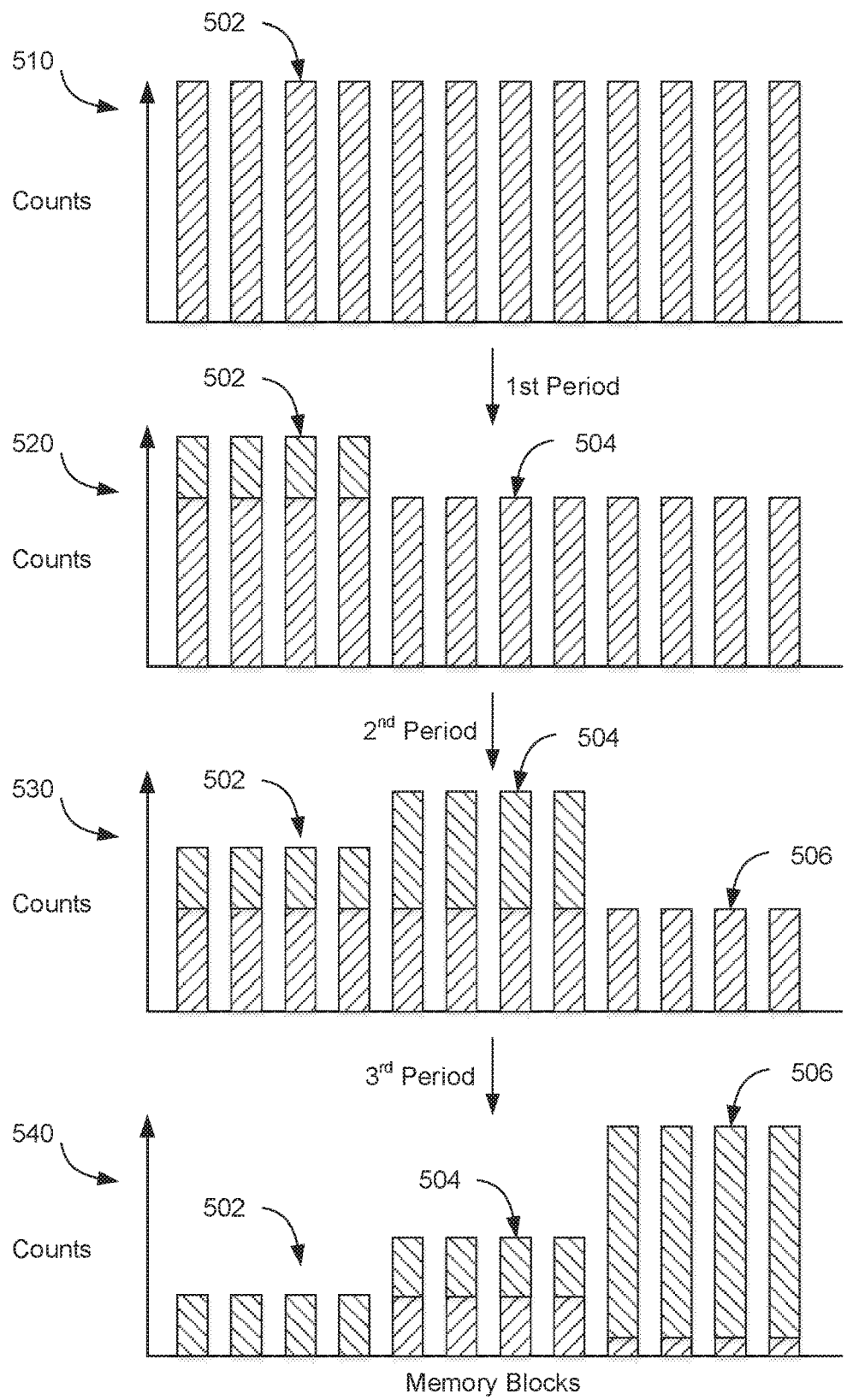
FIG. 5 shows a schematic representation of a count of read operations for a memory block, according to an embodiment of the present disclosure.

FIG. 5 shows illustrative example representations 510, 520, 530, and 540, each representing the values of counts 208 corresponding to memory blocks 206 after different periods of process 400. Representation 510 corresponds to an initial state of the counts 208. Representation 520 corresponds to a $1^{st}$ state of the counts 208 after one period of process 400. Representation 530 corresponds to a $2^{nd}$ state of the counts 208 after two periods of process 400. Representation 540 corresponds to a $3^{rd}$ state of the counts 208 after three periods of process 400.

Representation 510 illustrates the values of counts 208 corresponding to memory blocks 206 at an initial state. In this example, the initial state of all of the counts 208 is the same. In other embodiments, the initial state of all of the counts 208 may not be the same.

Representation 520 illustrates the values of counts 208 corresponding to memory blocks 206 after one period of process 400. In this example, the memory block 206 corresponding to count 502 is checked for error levels and the count 502 is incremented up to a new limit. Memory block 206 corresponding to count 504 is not checked for error levels because a predetermined number of memory blocks 206 were already checked during the first period. In this example, four of the twelve memory blocks are checked every period.

Representation 530 illustrates the values of counts 208 corresponding to memory blocks 206 after two periods of process 400. In this example, the memory block 206 corresponding to count 504 is checked for error levels and the count 504 is incremented up to a new limit. Memory blocks 206 corresponding to count 502 and count 506 are not checked for error levels because a predetermined number of memory blocks 206 were already checked during the second period. In representation 530, eight of the twelve memory blocks 206 have had their count incremented after two periods of process 400.

Representation 540 illustrates the values of counts 208 corresponding to memory blocks 206 after three periods of process 400. In this example, the memory block 206 corresponding to count 506 is checked for error levels and the count 506 is incremented up to a new limit. Memory blocks 206 corresponding to count 502 and 504 are not checked for error levels because a predetermined number of memory blocks 206 were already checked during the third period. In representation 540, all twelve of the memory blocks 206 have had their count incremented after three period of process 400.

In this example, after a fourth period of process 400, the memory block corresponding to count 502 is checked for error levels and the count 502 is incremented up to a new limit because count 502 is included in the group of lowest counts 208.

Other objects, advantages and embodiments of the various aspects of the present invention will be apparent to those who are skilled in the field of the invention and are within the scope of the description and the accompanying Figures. For example, but without limitation, structural or functional elements might be rearranged consistent with the present invention. Similarly, principles according to the present invention could be applied to other examples, which, even if not specifically described here in detail, would nevertheless be within the scope of the present invention.

I claim:

1. A data storage device comprising:
a non-volatile semiconductor memory device configured to store data in a plurality of memory blocks; and
a controller communicatively coupled to the non-volatile semiconductor memory device, configured to:
determine a number of read operations performed on each of the plurality of memory blocks;
identify a predetermined number of memory blocks of the plurality of memory blocks, each of the predetermined number of memory blocks having the number of read operations greater than a predetermined value; and
determine, for each of the predetermined number of memory blocks, an integrity of the stored data in the memory block, wherein a number of memory blocks of the plurality of memory blocks having the number of read operations greater than the predetermined value is greater than the predetermined number.

2. The data storage device of claim 1, wherein the controller is configured to determine the integrity of the stored data in the memory block periodically.

3. The data storage device of claim 2, wherein the period is dynamically adjusted based on a rate of arrival of read memory requests at the data storage device.

4. The data storage device of claim 1, wherein the controller is further configured to, in response to determining that the integrity of the stored data in the memory block is above a threshold,
read the stored data in the memory block;
error correct the stored data in the memory block; and
copy the stored data to a secondary memory block.

5. The data storage device of claim 1, wherein the controller is configured to, in response to determining that the integrity of the stored data in the memory block is below a threshold, set the predetermined value to a new limit.

6. The data storage device of claim 4, wherein the controller is further configured to determine an average number of memory blocks storing data corresponding to a plurality of integrities above the threshold.

7. The data storage device of claim 6, wherein a number of the identified memory blocks is greater than the average number of memory blocks.

8. The data storage device of claim 1, wherein the controller is further configured to dynamically adjust the predetermined number based on a total hours of operation of the data storage device.

9. The data storage device of claim 1, wherein the controller is further configured to dynamically adjust the predetermined number based on a rate of arrival of read memory requests at the data storage device.

10. The data storage device of claim 1, wherein determining the integrity of the stored data in the memory block comprises determining an error level of the stored data in at least one memory page of the memory block.

11. The data storage device of claim 1, wherein the predetermined value is greater than zero.

12. A method of managing a plurality of memory blocks in a data storage device, the method comprising:
storing data in a plurality of memory blocks;
determining a number of read operations performed on each of the plurality of memory blocks;
identifying a predetermined number of memory blocks of the plurality of memory blocks, each of the predetermined number of memory blocks having the number of read operations greater than a predetermined value; and
determining, for each of the predetermined number of memory blocks, an integrity of the stored data in the memory block, wherein a number of memory blocks of the plurality of memory blocks having the number of read operations greater than the predetermined value is greater than the predetermined number.

13. The method of claim 12, further comprising determining the integrity of the stored data in the memory block periodically.

14. The method of claim 13, wherein the period is dynamically adjusted based on a rate of arrival of read memory requests at the data storage device.

15. The method of claim 10, further comprising, in response to determining that the integrity of the stored data in the memory block is above a threshold,
reading the stored data in the memory block;
error correcting the stored data in the memory block; and
transferring the stored data to a secondary memory block.

16. The method of claim 10, further comprising, in response to determining that the integrity of the stored data in the memory block is below the threshold, setting the predetermined value to a new limit.

17. The method of claim 15, further comprising, determining an average number of memory blocks storing data corresponding to a plurality of integrities above the threshold.

18. The method of claim 17, wherein a number of the identified memory blocks is greater than the average number of memory blocks.

19. The method of claim 10, further comprising, dynamically adjusting the predetermined number based on a total hours of operation of the data storage device.

20. The method of claim 10, further comprising, dynamically adjusting the predetermined number based on a rate of arrival of read memory requests at the data storage device.

21. The method of claim 10, wherein determining the integrity of the stored data in the memory block comprises determining an error level of the stored data in at least one memory page of the memory block.

22. The method of claim 10, wherein the predetermined value is greater than zero.

* * * * *